(12) United States Patent
Takizawa

(10) Patent No.: US 9,355,702 B2
(45) Date of Patent: May 31, 2016

(54) SEMICONDUCTOR MEMORY DEVICE AND DRIVING METHOD OF THE SAME

(71) Applicant: KABUSHIKI KAISHA TOSHIBA, Tokyo (JP)

(72) Inventor: Ryousuke Takizawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 14/665,680

(22) Filed: Mar. 23, 2015

(65) Prior Publication Data

US 2015/0194202 A1 Jul. 9, 2015

Related U.S. Application Data

(63) Continuation of application No. 13/606,793, filed on Sep. 7, 2012, now Pat. No. 8,988,933.

(30) Foreign Application Priority Data

Mar. 22, 2012 (JP) .................. 2012-065370

(51) Int. Cl.
G11C 11/00 (2006.01)
G11C 11/16 (2006.01)
G11C 5/14 (2006.01)
G11C 11/15 (2006.01)

(52) U.S. Cl.
CPC ............ *G11C 11/1697* (2013.01); *G11C 5/148* (2013.01); *G11C 11/15* (2013.01); *G11C 11/16* (2013.01); *G11C 5/14* (2013.01); *G11C 5/143* (2013.01); *G11C 5/144* (2013.01)

(58) Field of Classification Search
CPC ........ G11C 11/16; G11C 11/15; G11C 5/143; G11C 5/14; G11C 5/144

USPC ...................................... 365/158, 227, 230.03
See application file for complete search history.

(56) References Cited

U.S. PATENT DOCUMENTS

| 7,460,428 B2 | 12/2008 | Joo et al. |
| 7,996,605 B2 | 8/2011 | Koga |
| 8,988,933 B2 * | 3/2015 | Takizawa ..................... 365/158 |
| 2006/0023510 A1 | 2/2006 | Watanabe |
| 2008/0112250 A1 * | 5/2008 | Freebern ................. G11C 5/14 365/227 |

(Continued)

FOREIGN PATENT DOCUMENTS

| JP | 10069336 A | 3/1998 |
| JP | 2002333933 A | 11/2002 |

OTHER PUBLICATIONS

JEDEC Standard, Lower Power Double Date Rate 2 (LPDDR2), JESD209-2A (Revision of JESD209-2, Mar. 2009), Oct. 2009, JEDEC Solid State Technology Association, 232 pages.

*Primary Examiner* — Toan Le

(74) *Attorney, Agent, or Firm* — Patterson & Sheridan, LLP

(57) ABSTRACT

A non-volatile semiconductor memory device that can reduce power consumption includes plural memory banks containing nonvolatile plural memory cells. A common data bus is shared by plural memory banks and transmits the data of the memory cells. The plural switches are provided respectively between the electric source and plural memory banks. A controller controls the plural switches. The controller, in the data reading-out action or the data writing-in action, makes at least one of the switches corresponding to at least one of the memory banks accessible in a conduction state, and other switches in a non-conduction state.

16 Claims, 8 Drawing Sheets

(56) References Cited

U.S. PATENT DOCUMENTS

2010/0149900 A1  6/2010  Kitayama
2013/0242684 A1* 9/2013 Takizawa ............... G11C 8/14
                                                365/230.02

* cited by examiner

Fig. 5A

| DPD | |
|---|---|
| SW 0 | OFF |
| SW 1 | OFF |
| SW 2 | OFF |
| SW 3 | OFF |

Fig. 5B

| IDLE(ACCESS TO BNK0) | |
|---|---|
| SW 0 | ON |
| SW 1 | OFF |
| SW 2 | OFF |
| SW 3 | OFF |

SEMICONDUCTOR MEMORY DEVICE AND DRIVING METHOD OF THE SAME

CROSS-REFERENCE TO RELATED APPLICATION

This application is a continuation of U.S. patent application Ser. No. 13/606,793, filed on Sep. 7, 2012, assigned U.S. Pat. No. 8,988,933, which will issue on Mar. 24, 2015, which is based upon and claims the benefit of priority from Japanese Patent Application No. 2012-065370, filed Mar. 22, 2012; the entire contents of each of which are incorporated herein by reference.

FIELD

Embodiments described herein relate to a semiconductor memory device and a driving method of the same.

BACKGROUND

In general, DRAM (Dynamic Random Access Memory) and other volatile memories are currently designed to JEDEC (JEDEC Solid State Technology Association) specifications covering LPDDR2 (Low Power Double Data Rate 2). In LPDDR2, the DPD (Deep Power Down) state is specified. In the DPD state the DRAM element is cutoff from the outside electric source to reduce electric power consumption during the waiting state.

However, when the DRAM element transitions to the DPD state the data stored in the memory vanishes. Therefore, when the element returns to the idle state (the electric passage state) from the DPD state, it is necessary to rewrite (initialize) the data to the memory again. Therefore, it takes a relatively long time and a large electric power consumption to return from the DPD state. Thus, in a system using DRAM, or other volatile memories, the memory element is often maintained in an idle state, which has a shorter return time than the DPD state, instead of the DPD state.

In the idle state, it is necessary to carry out a refreshing action periodically to maintain the data inside the memory. Therefore, even in the idle state, electric power is still required to a certain extent.

During the transition from the idle state to the DPD state considerable electric power is consumed when the electric power is supplied to the cutoff portion of the memory element. Therefore, if the DPD state is entered for just a short interval before the return to the idle state, significant electric power is consumed during the return and potentially no overall power savings will be realized from entering the DPD state.

DESCRIPTION OF THE DRAWINGS

FIGS. 5A and 5B are tables showing the states of the switches SW0 to SW3 of the MRAM of the first embodiment.

DETAILED DESCRIPTION

In general, example embodiments related to the present disclosure will be explained with reference to figures. The present embodiments are examples and are not intended to limit the present disclosure. Other embodiments may be in keeping with the present disclosure though not explicitly described.

According to an embodiment, there is provided a semiconductor memory device which suppresses electric power consumption as well as improving the device's activation rate.

The semiconductor memory device according to the present embodiment is provided with memory banks containing nonvolatile memory cells. A common data bus is shared by the memory banks and the common data bus transmits data of the memory cells. Switches are arranged between the electric source and memory banks. A controller controls the switches. The controller, when reading data (a data reading-out action) or writing data (a data writing-in action), places at least one of the switches corresponding to at least one of the memory banks in a conduction state and places other switches in a non-conduction state.

The following embodiments can be used appropriately in a variety of types of non-volatile memories like the magnetic random access memory (MRAM), the resistance random access memory (ReRAM), the phase-change random access memory (PRAM), the ferroelectoric random access memory (FeRAM), and so on. In the following embodiments, the MRAM will be explained as an example of the resistance changing type of memory, but the invention is not so limited.

First Embodiment

Figure 1:
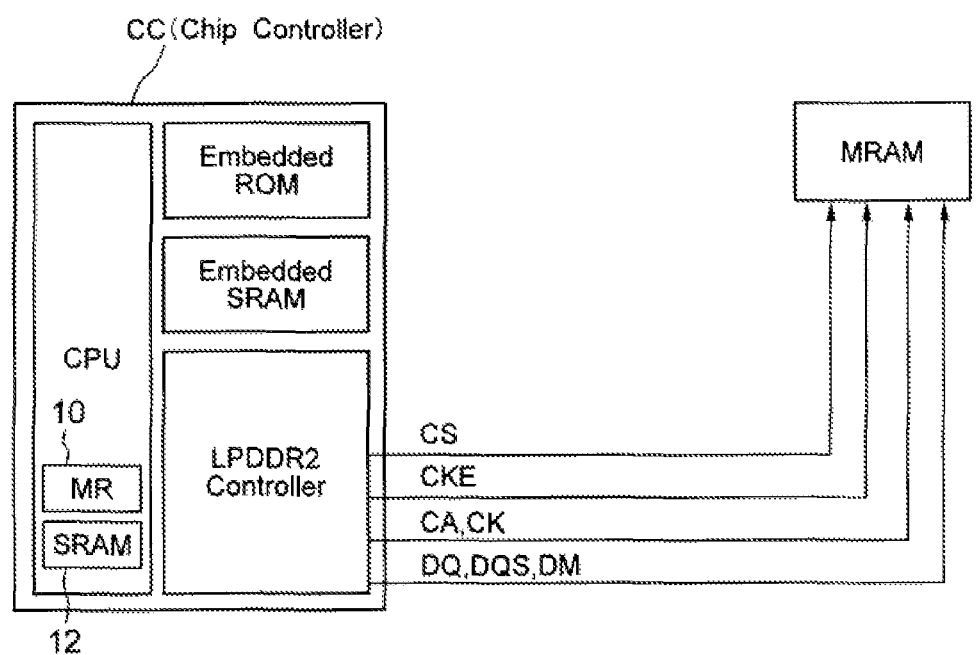
FIG. 1 is a block diagram showing an MRAM and a chip controller CC according to a first embodiment.

FIG. 1 is a block diagram showing the MRAM and a chip controller CC according to the first embodiment. The chip controller CC is provided with the central processing unit (CPU), the read only memory (ROM), the static random access memory (SRAM), and the LPDDR2 controller. The LPDDR2 controller outputs the chip selection signal CS, the clock enable signal CKE, the command address signal CA, the clock signal CK, the data DQ, the strobe signal DQS, the mask data DM and so on to the MRAM. The chip controller CC controls the MRAM with these signals supplied by the LPDDR2 chip.

In general, the specifications of the LPDDR2 from JEDEC are used with DRAM and other volatile memories. However, in the present embodiment, the LPDDR2 specifications are applied an MRAM non-volatile memory.

The CPU controls the chip controller CC as a whole. The CPU includes the mode register 10 and the SRAM 12. In regard to the mode register 10 and the SRAM 12, a description will be given later.

Figure 2:
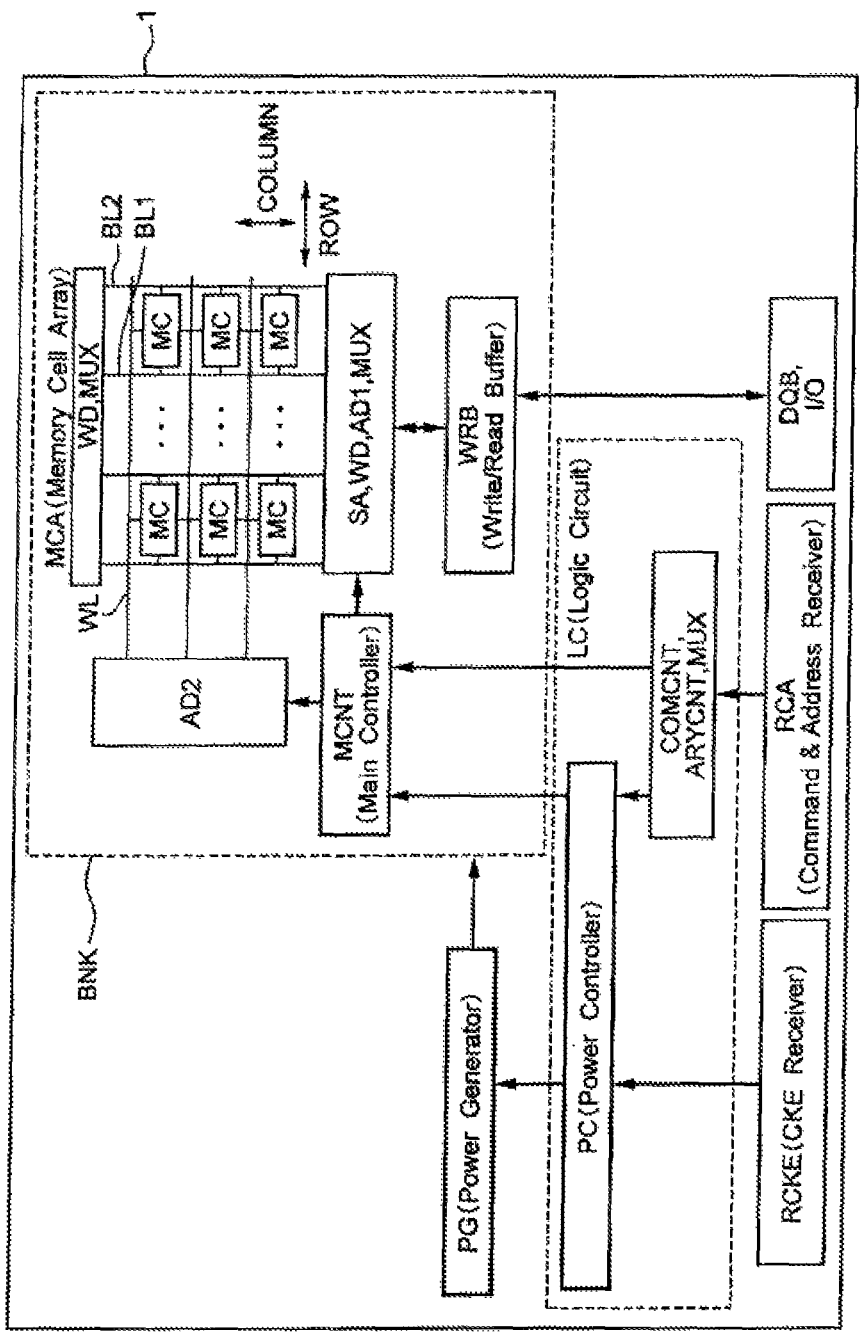
FIG. 2 is a block diagram showing the components of the MRAM of the first embodiment.

FIG. 2 is a block diagram showing the components of the MRAM according to the first embodiment. The chip 1 of the MRAM is provided with the memory cell array MCA, the power generator PG, the logic circuit LC, the clock enable receiver RCKE, the command address receiver RCA, the data buffer DQB, and the input-output section I/O.

The memory cell array MCA is provided with, for example, plural memory cells MC in a 2-dimensional arrangement in a matrix form. The memory cell MC is a non-volatile memory cell and includes, for example, a MTJ element. Each memory cell MC is connected with a bit line pair (for example, the bit line BL1 and the bit line BL2 shown in FIG. 2) and a word line WL. In other words, one end of the memory cell MC is connected to one of the bit line pair (e.g., bit line BL1), and the other end is connected to other bit line of the pair (e.g., bit line BL2). The bit line pair BL1 and BL2 extends in a direction perpendicular to the word line WL.

The memory cell array MCA is further provided with the sense amp section SA, the write driver WD, the address decoders AD1 and AD2, the main controller MCNT, and the write-read buffer WRB.

The sense amp section SA is connected to, for example, the memory cell MC via the bit line BL1 and has the function of detecting the data in the memory cell MC. The write driver WD is connected to, for example, the memory cell MC via the bit lines BL1 and BL2 and has the function of writing data to the memory cell MC.

The main controller MCNT transmits the data received from the DQ buffer DQB to the write driver WD so that the data are written to the desired memory cell MC. The main controller MCNT also transmits the data read from the desired memory cell MC to the DQ buffer DQB.

The address decoder AD1 is constituted according to the address from the command address receiver RCA or by the selection of the bit line pair. The address decoder AD2 is constituted according to the address from the command address receiver RCA or by the selection of the word line WL.

The write-read buffer WRB temporarily stores the write data (written-in data) input via the input-output section I/O and the data buffer DQB, or temporarily stores the data read (read out data) from the memory cell MC.

The data buffer DQB temporarily holds written-in data and read out data, so the read out data can be output via the input-output section I/O or and the written-in data can be input to memory array via the input-output section I/O.

The clock enable receiver RCKE receives the clock enable signal CKE for enabling the clock signal or not and, in the case of the activation of the clock enable signal CKE, the clock signal is transmitted.

The power generator PG generates an electric source voltage for the driving of the memory cell array MCA. For example, the power generator PG increases or decreases the electric source voltage supplied from the outside to generate the electric source voltage VDD or the reference voltage VSS.

The chip 1 is provided with the power controller PC, the command controller COMCNT, the array controller ARYCNT, and so on. The power controller PC controls the power generator PG, the main controller MCNT, and the command address receiver RCA. The power controller PC can bring about the selectively initiated state (the on state) or the paused state (the off state) of the power generator PG, the main controller MCNT, and the command address receiver RCA.

The command controller COMCNT receives the commands for a variety of actions such as the reading-out action from the command address receiver RCA, the reading-in action, and so on. The main controller MCNT is controlled according to these commands.

The command address receiver RCA receives commands and addresses for controlling actions of the memory cell array MCA. The command address receiver RCA receives, for example, the row address, the page address, and so on as addresses. The command address receiver RCA also receives, for example, the active command ACT, the power down command PD, the deep power down command DPD, the MR write command MRW, the MR read command MRR, the reset command RST, and so on as commands. With these commands, the memory cell array MCA can carry out a variety of actions.

The command controller COMCNT controls the array controller ARYCNT and so on according to the commands from the outside. The array controller ARYCNT, on the basis of data obtained from mode register MR, controls the MRAM inside of the memory banks BNK0 to BNK3, the switches SW0 to SW3, and so on.

Figure 3:
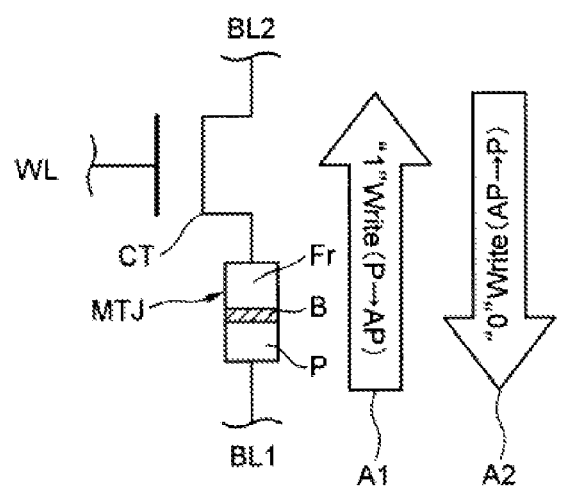
FIG. 3 is an illustrative diagram showing the components of a single memory cell MC.

FIG. 3 is an illustrative diagram showing the components of a single memory cell MC. Each memory cell (MC) contains a magnetic tunnel junction (MTJ) element, and a cell transistor CT. The MTJ element depicted is a STT (Spin Transfer Torque)-MTJ element. The MTJ element and the cell transistor CT are connected in series between the bit line BL1 and the bit line BL2. In the memory cell MC, the cell transistor CT is installed on the BL2 side, and the MTJ element is installed on the BL1 side. The gate of the cell transistor CT is connected on the word line WL.

The STT-MTJ element utilizing the TMR (tunneling magnetoresistive) effect has a laminated structure including two sheets of ferromagnetic layers with a nonmagnetic layer (the insulation thin layer) sandwiched between them. The STT-MTJ element records (memorizes) the digital data by a change in magnetic resistance according to the deflecting electrode tunnel effect.

The MTJ element acquires the low resistance state and the high resistance state by the magnetization arrangement of two sheets of ferromagnetic layers. For example, if the low resistance state is defined as data "0" and the high resistance state is defined as data "1," 1 bit data can be recorded in the MTJ element. Of course, it is also acceptable that the low resistance state is defined as data "1" and the high resistance state is defined as data "0."

The MTJ element, as shown in FIG. 3, may be, for example, constituted by lamination in the sequence of the fixation layer P, the tunnel barrier layer B, and the recording layer Fr. The fixation layer P and the recording layer Fr are ferromagnetic material, and the tunnel barrier layer B is an insulation film. The fixation layer P has a fixed direction of magnetization. The recording layer Fr has a variable direction of magnetization and the data are recorded by reference to the direction of its magnetization.

If an electric current above the reverse threshold value current flows in the direction of the arrow symbol A1 during writing, the recording layer Fr will be in an anti-parallel state with respect to the direction of the magnetization of the fixation layer P. In such a case, the MTJ element will be in the high resistance state (data "1," according to the present scheme). If the electric current above the reverse threshold value current flows in the direction of the arrow symbol A2 during writing, the recording layer Fr will be in a parallel state with respect to the direction of the magnetization of the fixation layer P. In such a case, the MTJ element will be in the low resistance state (data "0," according to the present scheme). In this way, the MTJ element can write in different data according to the direction of the electric current flow.

Figure 4:
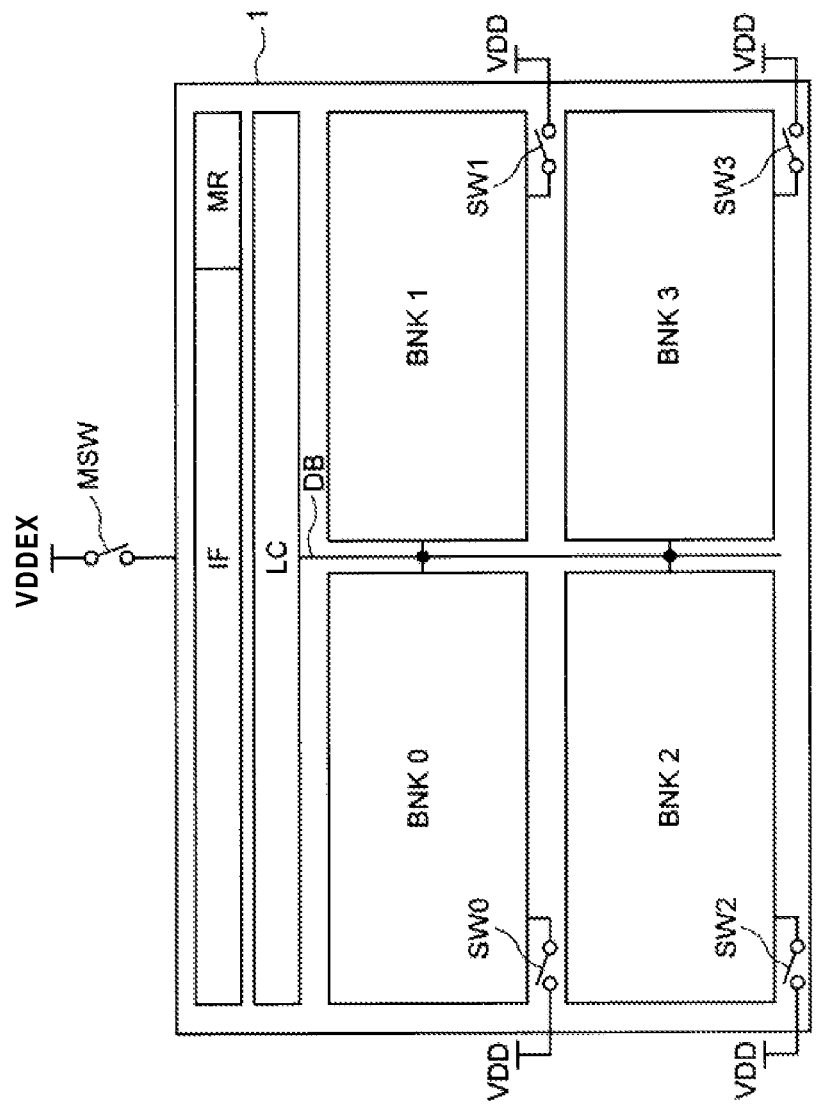
FIG. 4 is a block diagram showing the components of the MRAM of the first embodiment.

FIG. 4 is a block diagram showing schematically the components of the MRAM according to the first embodiment. FIG. 4 shows four memory banks BNK0 to BNK3 containing memory cells. The memory banks BNK0 to BNK3 share the common data bus DB. The common data bus DB transmits the data of the memory cells inside the memory banks BNK0 through BNK3 to the logic circuit LC and the interface IF.

The memory banks BNK0 to BNK3 are connected to the electric source VDD via the respective switches SW0 to SW3. By having the switches SW0 to SW3 on or off, the memory banks BNK0 to BNK3 receive the electric power from the electric source VDD or are cut off from the electric source VDD. The switches SW0 to SW3 can be formed by using FETs (Field Effect Transistors).

The logic circuit LC controls the memory banks BNK0 to BNK3, the switches SW0 to SW3, and so on. The interface IF includes the I/O circuit for outputting the data from the common data bus DB to the outside of the memory chip 1 or for transmitting the data from the outside of the memory chip 1 to the common data bus DB.

The mode register MR stores the action states of the MRAM and so on. For example, the mode register MR issues the inside command corresponding to the DPD command, the inside command corresponding to the PAU (Partial Array Usage) command, the active command and determines the type of burst, the burst length, the latency period and other MRAM actions. The mode register MR also stores the inside set values showing the MRAM states.

The mode register MR also stores, beforehand, the memory size activated by the PAU command. For example, in the mode register MR, activation is made possible by the PAU command for each memory bank when setting the memory size of the PAU command in the memory bank MB.

The memory chip containing the memory banks BNK0 to BNK3, the interface IF, the logic circuit LC, the mode register MR, and so on is connected to the electric source VDD via the main switch MSW. The main switch MSW can cut off the electric power supply to the memory chip as a whole.

The mode register 10 inside the CPU of the chip controller CC in FIG. 1, stores the action states of the MRAM and so on in the same manner as the mode register MR inside the memory chip 1. In accessing any of the memory banks BNK0 to BNK3, the MRW (Mode Register Write)-PAU command is issued. The MRW-PAU command is a command for writing the set value of the mode register MR in the PAU mode into the mode register MR. By the MRW-PAU command, the PAU command of the mode register 10 is written in the mode register MR on the MRAM side. The MRAM, in accordance with the PAU command, accesses any of the memory banks BNK0 to BNK3. Furthermore, the SRAM 12 inside the CPU of the chip controller CC, depicted in FIG. 1, stores the address information for the memory banks that are the on state and are accessible and the memory banks that are in the off state and are not accessible.

When the MRAM returns from the DPD state to the idle state or the active state, the MRR (Mode Register Read)-PAU command is issued. In the DPD state, electric power is not supplied to the mode register 10 or the SRAM 12. Therefore, the PAU command stored in the mode register 10 and the SRAM. 12 is lost. But the mode register MR on the MRAM side maintains the PAU command. Therefore, when the MRAM returns from the DPD state to the idle state or the active state (by the MRR-PAU command) the data in the mode register MR on the MRAM side can be read out to the mode register 10 and the SRAM 12 on the CPU side.

The idle state is a state in which electric power is supplied to a selected memory bank (BNK0 in this example), and the commands for data read out and data write in can be received by the selected memory bank. The idle state is different from the waiting state in which the electric power to a bank is cut. In a deep power down, all memory banks will be in the waiting state. The memory bank BNK0 in the idle state is waiting for commands (the command waiting state). If a command is received, the memory bank BNK0 will be in an active state.

FIG. 5A and FIG. 5B are tables showing the states of the switches SW0 to SW3 of the MRAM according to the first embodiment. FIG. 5A shows the on/off states of switches SW0 to SW3 in the deep power down state (the DPD state). FIG. 5B shows the on/off states of switches SW0 to SW3 when the MRAM is in the idle state (or the active state when accessing only the memory bank BNK0). In the idle state, the active state, and the DPD state, the main switch MSW is in the on state, and the memory chip is supplied with power from the electric source.

As shown in FIG. 5A, when the MRAM of the present embodiment is in the DPD state, the switches SW0 to SW3 are in the off state (the non-conduction state). Therefore, the memory banks BNK0 to BNK3 do not receive electric power from the electric source VDD. Since the memory banks BNK0 to BNK3 are nonvolatile, the data can still be maintained even without the refreshing action which would be required with DRAM. In this way, according to the present embodiment, the MRAM can decrease the electric power consumption to the same extent as the DPD state of the LPDDR2 specifications (for the conventional DRAM).

Next, as shown in FIG. 5B, the memory bank BNK0 can be available for the data reading-out or data writing-in action. In this case, the logic circuit LC has the switch SW0 in the on state (the conduction state) and other switches SW1 to SW3 maintained in the off state (the non-conduction state). In other words, the logic circuit LC has memory bank BNK0 selected in the data reading-out or data reading-in action in the active state and the other unselected memory banks BNK1 to BNK3 in the DPD state.

In order to actuate the switches SW0 to SW3 in this manner, in the present embodiment, the PASR (Partial Array Self Refresh) command of the LPDDR2 specifications is used as a partial activation signal. The PASR command was originally used for the partial self-refreshing action in DRAM; however, in the present embodiment, the PASR command is used as a partial activation signal for the activation of a subset of available MRAM memory banks (BNK0 to BNK3 in this example). For example, the PASR command can be set so that one or more memory banks among the memory banks BNK0 to BNK3 can be selected. Furthermore, for the PASR command all of the memory banks BNK0 to BNK3 can also be selected by default if no subset is specified.

Here, since the PASR command is used as the partial activation signal, the PASR command is also called the PAU command. The PAU command is issued from the outside controller of the memory chip. An inside command is issued by the mode register MR on the basis of the PAU command from the outside to select the inside state or action of the MRAM.

For example, when accessing the memory bank BNK0, the MRAM receives the PAU command for the selection of the memory bank BNK0 and the DPD eject command DPDX for exiting the DPD state. The logic circuit LC, on the basis of the DPDX command and the PAU command, switches the switch SW0 to the conduction state while maintaining switches SW1 to SW3 in the non-conduction state. The switch SW0 corresponds to the selected memory bank BNK0. Since the selected memory bank BNK0 receives electric power from the electric source VDD, the MRAM can read data from the selected memory bank BNK0 or write data to the selected memory bank BNK0. The data reading-out action and the data writing-in action are the same as the publicly known actions.

As an example application, when MRAM according to a present embodiment is used in a portable machine instead of the DRAM, the MRAM maintains the DPD state (normal off) shown in FIG. 5A while waiting for user input or requests rather than the idle state shown in FIG. 5B. In doing so, the electric power consumption by the MRAM during the waiting period can be the same level as for the DPD state for DRAM. In general, the user of the portable machine often walks while holding the portable machine in the waiting state. The period of the waiting state is very long. Therefore, the suppression of the electric power consumption in the waiting state is tied with the suppression of the electric power consumption of the battery of the portable machine and a reduction in the frequency of electric charging.

Furthermore, the MRAM, when performing the data reading-out action or the data-writing-in action, activates the required memory bank BNK0 by using the DPDX command and the PAU command and keeps the memory banks BNK1 to BNK3 not requiring accessing in the DPD state. In doing so, wasteful electric power consumption can also be reduced for the MRAM when returning to the idle state or the active state. Therefore, when MRAM according to the present embodiment is used in a portable machine, the electric power drawn from the battery of the portable machine is further reduced and time between battery recharging is improved.

Of course, when all memory banks BNK0 to BNK3 inside the memory chip must be accessed, it is acceptable that the logic circuit LC makes all the switches SW0 to SW3 in the conduction state and all the memory banks BNK0 to BNK3 in the active state. In this case, the MRAM may make the PAU command at the default value.

In the present embodiment, the mode register MR receives electric power from the electric source VDD as long as the main switch MSW is not in the non-conduction state. Therefore, the mode register MR still receives electric power from the electric source VDD while the MRAM is in the DPD state. Thus, even if it uses volatile-type storage, the mode register MR of the present embodiment can maintain its data. If the main switch MSW is switched to a non-conduction state, then upon its return to the conduction state, the data in the mode register MR must be reloaded from outside the MRAM since data previously stored in the mode register MR is lost when the main switch MSW is turned off. At this time, the registered value of the PAU command returns to the initial state (the default value).

Figure 6:
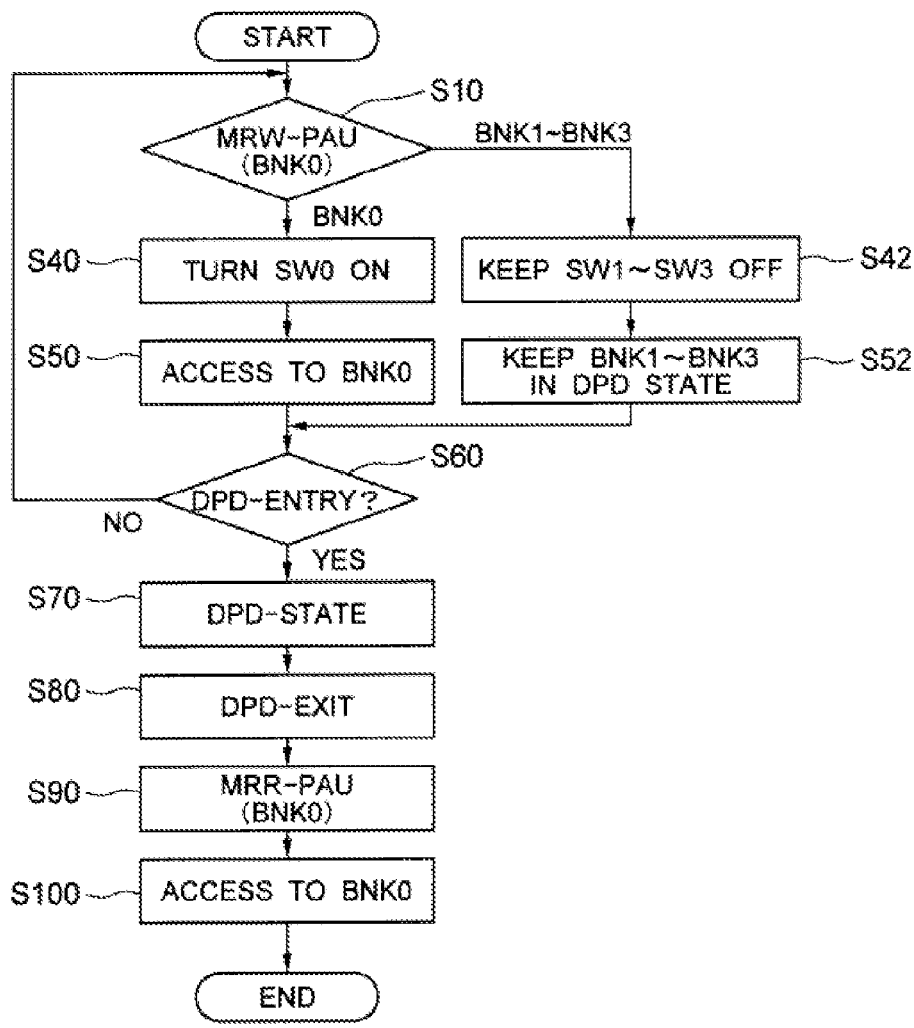
FIG. 6 is a flow diagram showing the operation of the MRAM of the first embodiment.

FIG. 6 is a block diagram showing the actions of the MRAM according to the first embodiment. FIG. 6 shows the actions of the MRAM when the DPD command is issued while the memory bank BNK0 is being accessed.

First of all, the MRAM is in the active state with the memory bank BNK0 being accessed. In this case, the MRW-PAU command designating the memory bank BNK0 is issued (S10). In doing so, the set value of the mode register MR in the PAU mode is written to the mode register MR. Here, the MRW-PAU command includes the address of the memory bank BNK0 and allows selective access to the memory bank BNK0. In doing so, the logic circuit LC, with the memory banks BNK1 to BNK3 being maintained in the DPD state, shifts the memory bank BNK0 from the DPD state to the active state. In more detail, for the logic circuit LC, with the switches SW1 to SW3 being maintained in the off state, the switch SW0 is switched over to the on state (S40, S42). In doing so, the memory banks BNK1 to BNK3 are cut off from the electric source VDD and power is supplied only to the memory bank BNK0.

The MRAM then accesses the selected memory bank BNK0 via the common data bus DB and reads out the data or writes in the data (S50). At this time, the unselected memory banks BNK1 to BNK3 maintain the DPD state.

In the embodiment described above, the memory bank BNK0 is selectively accessed in the data reading-out actions or the data writing-in actions. However, it is also acceptable that one or more memory banks (any or all of the memory banks BNK0 to BNK3) can be accessed. In this case, the memory bank(s) designated in the MRW-PAU command of the step S10 can be changed.

In the case when the DPD command has not been issued (NO in S60), the MRAM continuously repeats steps S10 to S52. However, the MRW-PAU command issued in step S10 may designate respectively different memory banks BNK0 to BNK3.

In the case when the DPD command is issued when memory bank BNK0 is in the active state (YES of S60), the MRAM shifts from the active state to the DPD state (S70). This DPD state is the same as that explained with reference to FIG. 5A. At this time, the data in the mode register 10 and the SRAM 12 on the CPU side vanish.

Next, if the DPDX command is issued (S80), the MRR-PAU command is issued (S90). At this time, the mode register MR on the MRAM side maintains the set register values of the PAU command. Therefore, by the MRR-PAU command, the set values of the mode register MR on the MRAM side are read out to the mode register 10 and the SRAM 12 on the CPU side. In doing so, access to the memory bank BNK0 is made possible (S100).

By having the switches SW0 to SW3 in the off state during the waiting period, the device puts the memory banks BNK0 to BNK3 virtually in the DPD state. By switching switch SW0 to the on state, memory bank BNK0 is made accessible for data reading-out actions or data writing-in actions, by using the DPDX command and the PAU command in the on state. In doing so, the MRAM according to the present embodiment can reduce the electric power consumption both during the waiting state and during the return to the active state.

Modified Example 1

Figure 7:
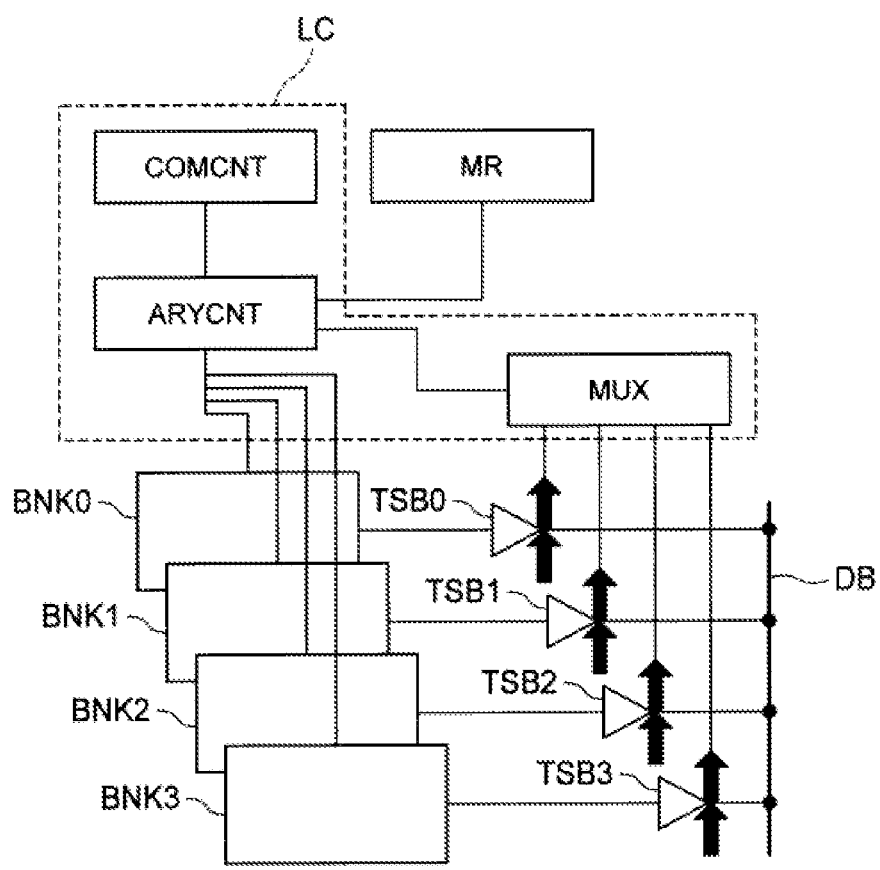
FIG. 7 is a block diagram showing a modified example of the first embodiment.

FIG. 7 is a block diagram showing a modified example of the first embodiment. In this modified example, the tri-state buffers (to be simply called buffers hereafter) TSB0 to TSB3 are provided respectively between the memory banks BNK0 to BNK3 and the common data bus DB. The tri-state buffers TSB0 to TSB3 serve as separation elements and each can have three states of theoretically high state, theoretically low state, and high impedance state (HiZ state).

The memory banks BNK0 to BNK3 share the common data bus DB. Therefore, when the memory bank BNK0 is being accessed indefinite signals may be output in the common data bus DB since the memory banks BNK1 to BNK3 are in the DPD state. The buffers TSB0 to TSB3 are provided as separation elements in order to suppress the indefinite signals from the unselected memory banks BNK1 to BNK3 while they are in the DPD state.

The buffers TSB0 to TSB3, in the data reading-out action and the data writing-in action, are in the conduction state between the selected memory bank BNK0 for accessing and the common data bus DB and the non-conduction state between the other memory banks BNK1 to BNK3 and the common data bus DB. By having the buffers set in this manner, the data propagated on the common data bus DB do not render an adverse effect on the unselected memory banks.

The logic circuit LC, as described above, is provided with the command controller COMCNT, the array controller ARYCNT, and the multiplexer MUX.

The multiplexer MUX controls the state of the buffers TSB0 to TSB3 according to the command controller COMCNT or the array controller ARYCNT. In the case of the selection of the selected memory bank BNK0, the multiplexer MUX has the buffer TSB0 in the conduction state (the low impedance state) and other buffers TSB1 to TSB3 in the non-conduction state (the high impedance state).

In this manner, the indefinite signals from the unselected memory banks BNK1 to BNK3 to the common data bus DB are cut off, and the exchange of the data between the selected memory bank BNK0 and the common data bus DB can be carried out.

Second Embodiment

Figure 8:
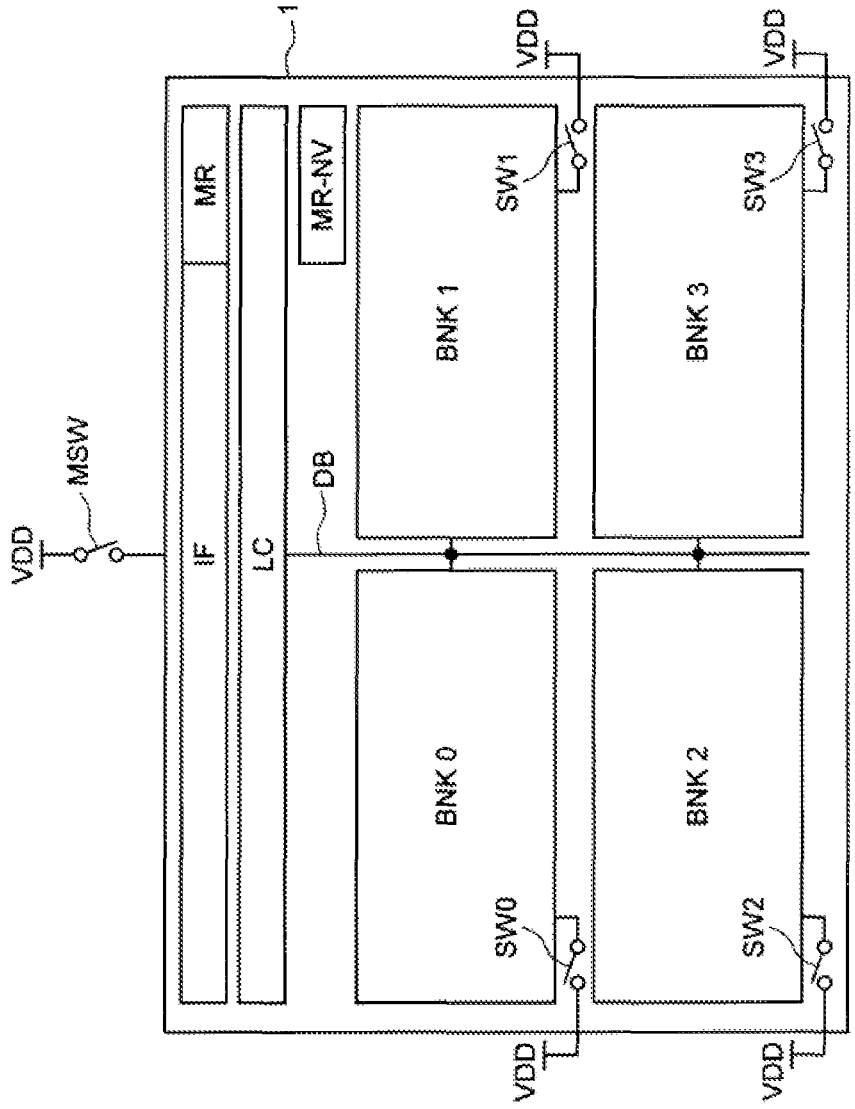
FIG. 8 is a block diagram showing the components of an MRAM according to a second embodiment.

FIG. 8 is a block diagram showing the components of the MRAM according to the second embodiment. The MRAM according to the second embodiment is further provided with the nonvolatile register MR-NV for backing up the inside data of the mode register MR. Other constitutions of the second embodiment are the same as the corresponding constitutions of the first embodiment.

The nonvolatile register MR-NV may also be constituted with the MRAM or other nonvolatile memories. The nonvolatile register MR-NV buffers the data of the mode register MR. Therefore, even if the main switch MSW is in the non-conduction state, the inside data of the mode register MR are maintained in the nonvolatile register MR-NV. Shortly after the return of the main switch MSW to the conduction state, the nonvolatile register MR-NV can reload the inside data to the mode register MR. Furthermore, by reloading the inside data of the nonvolatile register MR-NV to the mode register MR, the mode register MR can again maintain the values already set without initialization to the default values.

Thus, the MRAM according to the second embodiment, can also have the main switch MSW in the non-conduction state during the waiting period. When a memory bank needs to be accessed during the waiting period, the MRAM can load the inside data of the nonvolatile register MR-NV to the mode register MR then access the selected memory bank. The access to the selected memory bank can be carried out in the same manner as the first embodiment. Therefore, the second embodiment can achieve the same effect as the first embodiment.

Furthermore, the MRAM, according to the second embodiment can have the main switch MSW in the non-conduction state during the waiting period. Thus, the electric power consumption can be further reduced.

If it is in the same DPD state as in the first embodiment, the data of the mode register 10 and the SRAM 12 on the CPU side vanish. Therefore, as explained with reference to steps S90 and S100 in FIG. 6, after the issuing of the DPDX command, the MRR-PAU command is issued. By issuing the MRR-PAU command, the set values of the mode register MR on the MRAM side are read out to the mode register 10 and to the SRAM 12 on the CPU side. In doing so, access to the memory bank BNK0 is made possible.

The MRAM according to the first and second embodiments in this manner can be used instead of both existing nonvolatile ROM and volatile working memory (DRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

What is claimed is:

1. A semiconductor memory device, comprising:
a first memory cell array including a plurality of magnetic tunnel junction (MTJ) elements;
a second memory cell array including a plurality of MTJ elements;
an interface circuitry, conforming to a low power double data rate (LPDDR) specification, that is coupled to a clock signal, a command/address signal, a data signal, and a data strobe signal; and
a control circuitry coupled to a power source, the interface circuitry, and the first and second memory cell arrays, wherein
in a first operation state, the control circuitry causes the first memory cell array to be connected to the power source and to cause the second memory cell array to be disconnected from the power source, and
in a second operation state, the control circuitry causes both of the first and second memory cell arrays to be disconnected from the power source.

2. The semiconductor memory device according to claim 1, wherein the first operation state is an active state or an idle state.

3. The semiconductor memory device according to claim 1, wherein the second operation state is a deep power down state.

4. The semiconductor memory device according to claim 1, wherein the control circuitry comprises first and second switches, the first switch being coupled between the first memory cell array and the power source, and the second switch being coupled between the second memory cell array and the power source.

5. The semiconductor memory device according to claim 1, further comprising a first mode register configured to store operation states of the semiconductor memory device.

6. The semiconductor memory device according to claim 5, further comprising a second mode register configured to store operation states of the semiconductor memory device.

7. The semiconductor memory device according to claim 6, further comprising a non-volatile register capable of storing data from the second mode register and supplying stored data to the second mode register.

8. The semiconductor memory device according to claim 6, wherein the first mode register is decoupled from the power source during a deep power down state and data stored in the second mode register is supplied to the first mode register after a command to end the deep power down state is received.

9. A system, comprising:
a chip controller including a LPDDR2-compliant controller; and
a magnetic random access memory (MRAM) including an interface circuitry, a first memory cell array, and a second memory cell array, wherein
the LPDDR2-compliant controller supplies a clock signal, a command/address signal, a data signal, and a data strobe signal to the MRAM,
the interface circuitry of MRAM receives a first command and a second command from the LPDDR2-compliant controller by the command/address signal,
in response to the first command, the first memory cell array is coupled to a power source and the second memory cell array is decoupled from the power source, and
in response to the second command, the first and second memory cell arrays are decoupled from the power source.

10. The system according to claim 9, wherein
the interface circuitry causes the first memory cell array to be coupled to the power source and the second memory cell array to be decoupled from the power source in response to the first command, and
the interface circuitry causes the first and second memory cell arrays to be decoupled from the power source in response to the second command.

11. The system according to claim 9, wherein the chip controller includes a first mode register configured to store operation states of the MRAM.

12. The system according to claim 11, wherein the MRAM includes a second mode register configured to store operation states of the MRAM.

13. The system according to claim 12, further comprising a non-volatile register capable of storing data from the second mode register and supplying stored data to the second mode register.

14. The system according to claim 12, wherein the first mode register is decoupled from the power source during a deep power down state and data stored in the second mode register is supplied to the first mode register after a command to end the deep power down state is received.

15. The system according to claim 14, wherein the second mode register is coupled to the power source during the deep power down state.

16. The system according to claim 14, wherein the second mode register is decoupled from the power source during the deep power down state and data from the second mode register is stored in a non-volatile register during the deep power down state.

\* \* \* \* \*